United States Patent
Chen

(10) Patent No.: US 7,265,009 B2
(45) Date of Patent: Sep. 4, 2007

(54) HDP-CVD METHODOLOGY FOR FORMING PMD LAYER

(75) Inventor: Yao-Hsiang Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/067,043

(22) Filed: Feb. 24, 2005

(65) Prior Publication Data

US 2006/0189060 A1    Aug. 24, 2006

(51) Int. Cl.
*H01L 21/8238* (2006.01)
(52) U.S. Cl. ............... 438/199; 438/680; 257/E51.005; 257/E23.116; 257/E21.271; 257/E21.494
(58) Field of Classification Search ................ 438/199, 438/680, 787, 788, FOR. 395; 257/E51.005, 257/E23.116, E21.271, E21.494
See application file for complete search history.

(56) References Cited

U.S. PATENT DOCUMENTS 6,461,966 B1 * 10/2002 Chen et al. ................. 438/695
6,727,159 B2 * 4/2004 Chen et al. ................. 438/435
2003/0003682 A1 * 1/2003 Moll et al. .................. 438/435
2004/0178419 A1 * 9/2004 Song ........................... 257/103

FOREIGN PATENT DOCUMENTS

JP     2004235457 A  *  8/2004

* cited by examiner

*Primary Examiner*—Michelle Estrada
(74) *Attorney, Agent, or Firm*—Tung & Associates

(57) ABSTRACT

A method of forming an HDP-CVD pre-metal dielectric (PMD) layer to reduce plasma damage and/or preferential sputtering at a reduced a thermal budget including providing a semiconductor substrate comprising at least two overlying semiconductor structures separated by a gap; forming a PMD layer according to an HDP-CVD process over the at least two overlying semiconductor structures without applying a chucking bias Voltage to hold the semiconductor substrate.

27 Claims, 4 Drawing Sheets

HDP-CVD METHODOLOGY FOR FORMING PMD LAYER

FIELD OF THE INVENTION

This invention generally relates to HDP-CVD deposition processes and more particularly to a method for forming pre-metal dielectric (PMD) layers to improve a gap-filling ability and reduce plasma damage to advanced CMOS devices.

BACKGROUND OF THE INVENTION

As devices become smaller and integration density increases, high density plasma chemical vapor deposition (HDP-CVD) processes have become a key process due to superior gap-filling capability. In particular, high density plasma (HDP-CVD) processes, using plasma generating power sources such as electron cyclotron resonance (ECR) and inductively coupled plasma (ICP) processes produce high-quality silicon dioxide and silicon nitride layers. Generally, HDP-CVD provides a high density of plasma ions resulting in higher quality films at lower deposition temperatures compared to thermal process. HDP-CVD is particularly ideal for forming PMD oxide layers because of its superior gap filling capability. In an HDP-CVD process, both sputtering and deposition take place simultaneously, resulting in a deposition/sputter ratio (D/S) ratio that may be adjusted according to process parameters.

In prior art HDP-CVD deposition processes, an RF bias power is coupled to the semiconductor wafer by an E-chucking process, where a Voltage is applied to the wafer chuck to create an electrostatic attraction to the process wafer. The RF bias power serves to attract ions which sputter (etch) the wafer during deposition, thereby preventing a phenomenon known as crowning where the deposition material converges over a gap before the gap is completely filled with the deposition material. The deposition process is thereby capable of being tuned by adjusting a D/S ratio to avoid crowning and the creation of voids.

As CMOS device characteristic dimensions shrink to below about 0.1 micron including to about 0.6 microns, the issue of plasma induced damage to CMOS devices becomes a more important factor to consider as smaller CMOS devices have a lower acceptable plasma damage threshold. Prior art HDP-CVD processes may induce an unacceptable level of plasma damage in CMOS devices with characteristic dimensions less than about 0.1 microns.

In addition, the high density of the plasma can result in significant heating of the wafer during deposition requiring a cooled wafer chuck to cool the wafer during deposition. Prior art HDP-CVD deposition processes, including mechanisms for cooling the wafer may be less than adequate as device sizes shrink and devices become more sensitive to higher temperatures, for example including undesired diffusion of dopants in doped regions altering critical boundaries including source/drain extension (SDE) regions and source/drain regions.

For example, higher sputtering rates (lower D/S ratios), which are necessary for good gap-filling tends to increase the temperature of the wafer substrate. Prior art HDP-CVD processes have found it difficult to achieve good gap filling while maintaining the wafer temperature below a desired level. On the other hand, low D/S ratio with high sputtering rates to maintain a desired low temperature results in the creation of voids, thereby compromising device performance and reliability.

There is therefore a need in the semiconductor processing art to develop an improved HDP-CVD process including PMD layer formation whereby a sufficient gap filling ability is maintained while simultaneously reducing plasma damage and maintaining low process wafer deposition temperatures.

It is therefore an object of the invention to provide an improved HDP-CVD process including PMD layer formation whereby a sufficient gap filling ability is maintained while simultaneously reducing plasma damage and maintaining low process wafer deposition temperatures, in addition to overcoming other shortcomings and deficiencies of the prior art.

SUMMARY OF THE INVENTION

To achieve the foregoing and other objects, and in accordance with the purposes of the present invention, as embodied and broadly described herein, the present invention provides a method of forming an HDP-CVD pre-metal dielectric (PMD) layer to reduce plasma damage and maintain low process wafer temperature while simultaneously the gapfilling capability was maintained.

In a first embodiment, the method includes, providing a semiconductor substrate comprising at least two overlying semiconductor structures separated by a gap; forming a PMD layer according to an HDP-CVD process over the at least two overlying semiconductor structures without applying a chucking bias Voltage to hold the semiconductor substrate.

These and other embodiments, aspects and features of the invention will be better understood from a detailed description of the preferred embodiments of the invention, which are further described below in conjunction with the accompanying Figures.

DETAILED DESCRIPTION OF THE PREFERRED EMBODIMENTS

According to the present invention an HDP-CVD processing method is presented to improve a gap filling ability in a PMD layer deposition process, for example, avoid or reduce the formation of voids, while reducing plasma damage to CMOS devices and reducing a deposition temperature of the process wafer. It will be appreciated that a single or multi-step HDP-CVD process may be carried out optionally including cooling steps between deposition processes.

Figure 1A:
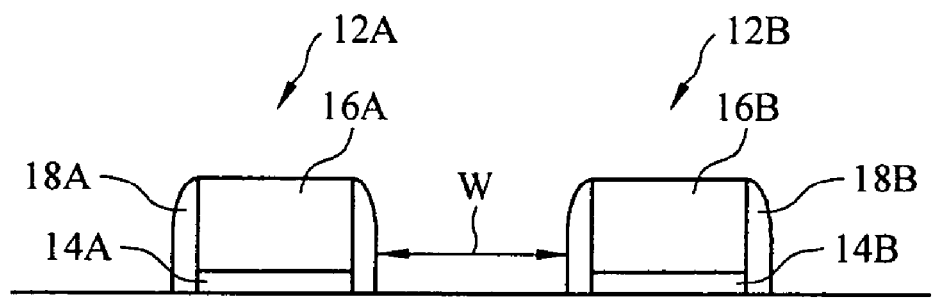
FIGS. 1A-1D are cross sectional side views of a portion of a semiconductor process wafer including CMOS devices at stages in manufacture according to the present invention.
Figure 1B:
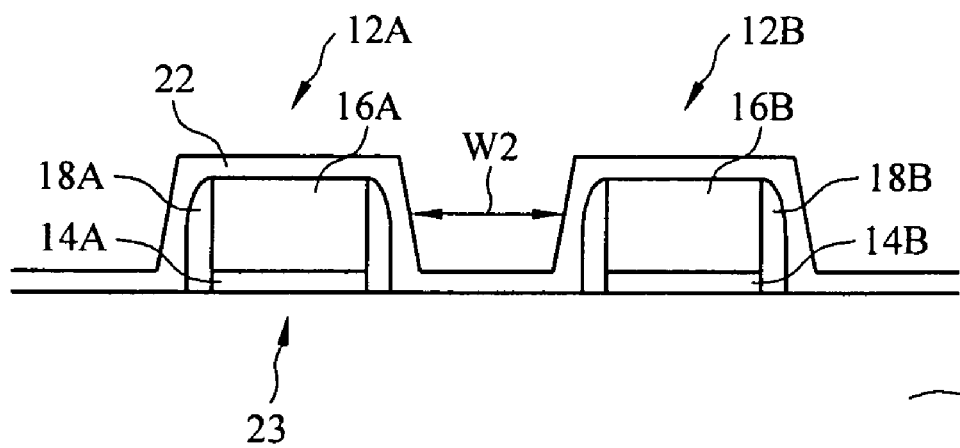

Referring to FIG. 1A, in an exemplary semiconductor manufacturing process for producing a pre-metal dielectric (PMD) layer, a semiconductor substrate 10 is provided including CMOS devices e.g., 12A and 12B, formed on the semiconductor substrate by conventional processes. For example, the semiconductor substrate 10 may include a variety of semiconductor substrates e.g., silicon, silicon on insulator (SOI), stacked SOI (SSOI), stacked SiGe on insulator (S-SiGeOI), SiGeOI, and GeOI, and combinations thereof. It will be appreciated that the CMOS devices 12A and 12B are separated a gap (space) having a width W, which may overlie an electrical isolation structure formed in the substrate, such as a shallow trench isolation (STI) structure (not shown) formed by conventional processes.

Still referring to FIG. 1A, gate dielectric portions e.g., 14A and 14B and gate electrode portions 16A and 16B are formed by conventional processes. For example, a gate dielectric layer is first deposited by conventional processes including chemical, thermal, or CVD deposition methods. $SiO_2$ including doped $SiO_2$ and/or high-K dielectrics (e.g., $K \geq 8$) may be used as the gate dielectric layer. A gate electrode material such as polysilicon, amorphous polysilicon, doped polysilicon, polysilicon-germanium, or combinations thereof is then deposited followed by conventional lithographic patterning and dry etching methods to form the gate structures 12A and 12B. Ion implantations, first to form e.g., LDD regions, (not shown) followed by formation of oxide and/or nitride sidewall spacers e.g., 18A, 18B on either side of the gate structures by conventional deposition and etching steps followed by another ion implant to form source and drain regions (not shown) adjacent the LDD regions.

Figure 1C:
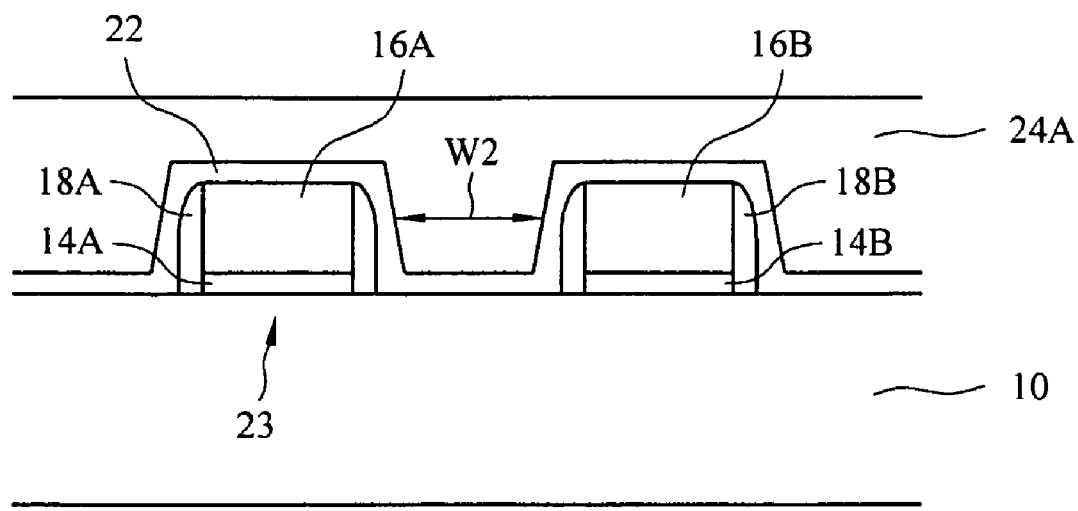

Referring to FIG. 1C, in an important aspect of the invention, a dielectric insulating layer, e.g., 24A, preferably including one or more of a phosphosilicate glass (PSG), borophosphosilicate glass (BPSG), and undoped silicate glass (USG), preferably PSG, is then deposited over the gate structures 12A and 12B, according to an HDP-CVD process. In an important aspect of the invention, the HDP-CVD process is carried out without a Voltage (e.g., DC) being applied to create an electrostatic charge to hold the process wafer backside (i.e., is unchucked). It will be appreciated that the HDP-CVD process may carried out without an E-Chuck being present, or at least without a chucking (electrostatic charge producing) Voltage being applied to hold the process wafer backside (i.e., without producing an electrostatic attraction response in the process wafer). An RF bias power, however, is preferably applied to the process wafer to control (adjust) a deposition temperature, preferably at an RF bias power of less than about 1500 Watts, more preferably less than about 1000 Watts.

Figure 2:
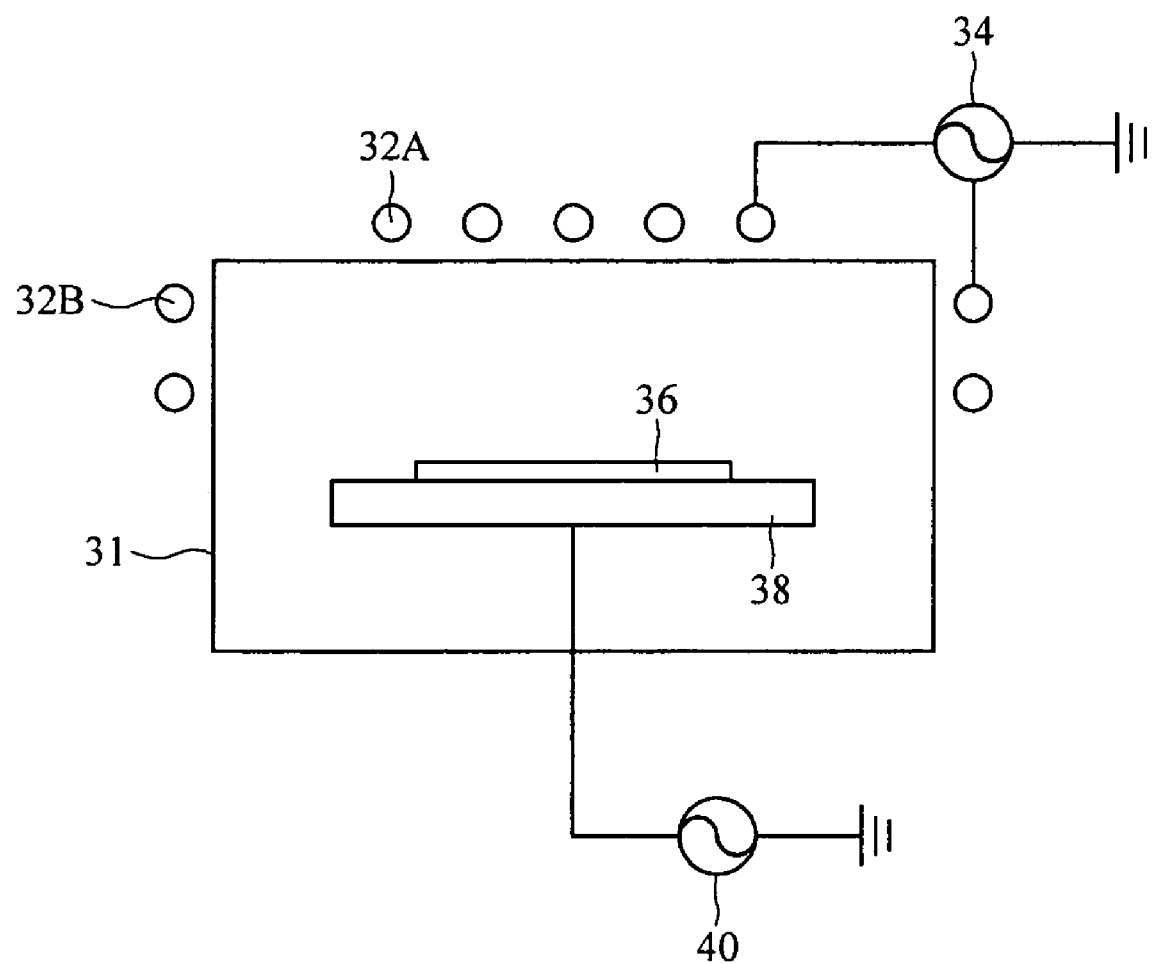
FIG. 2 is a schematic of an exemplary HDP-CVD reactor bfor carrying out an embodiment of the present invention.

For example, briefly referring to FIG. 2 is shown a partial schematic of an exemplary HDP-CVD ICP reactor 30. Shown are RF power coils e.g., 32A situated over a top portion of reactor chamber 31 and optionally disposed around a side portion e.g., 32B. The RF power coils are supplied by RF power source 34. A process wafer 36 is provided having a process surface facing up and a backside supported on a wafer support 38. The process wafer 36 is supplied with an RF bias power by RF bias power source 40 through wafer support 38. Both the RF power and the RF bias power are preferably adjusted to control the process wafer temperature during deposition, for example the RF bias power and the RF power producing a deposition/sputter (D/S) ratio contribute to the wafer temperature by plasma ions impacting the process side of the wafer. Importantly, a DC chucking Voltage is not applied to the wafer support 38 during the HDP-CVD deposition process.

For example, it has been found that reducing an RF bias power to preferred levels serves to increase a lower range of achievable HDP-CVD wafer deposition temperatures at a given deposition/sputter (D/S) ratio. In addition, plasma damage and/or preferential sputtering to underlying material layers including CMOS device components is reduced while maintaining a void-free gap filling ability. Moreover, the reduced RF bias power together with the absence of an electrostatic charge applied to a process wafer (absence of E-chucking) further improves the process. It has been found that an unchucked HDP-CVD process contributes to decreased plasma damage and/or preferentially sputtering over the wafer process surface. For example, it has been found that without electrostatically holding the wafer (without applying a high DC chucking Voltage) together with application of a relatively low (including zero) RF bias power, a deposition/sputter (D/S) ratio may be adjusted to a lower sputtering rate thereby reducing wafer deposition temperatures and wafer plasma damage. In addition, the creation of high Voltage fields in the process wafer is avoided, (e.g., greater than 850 Volts applied to E-chuck), believed to contribute to plasma damage processes during HDP-CVD. Moreover, it has been found that electrostatically holding the wafer (E-chucking) causes undesired stress fields in underlying layer components, which are believed to contribute to undesired preferential sputtering and/or plasma damage. For example, preferential sputtering and/or plasma damage may occur at exposed CMOS device portions, such as gate oxide and gate electrode portions and/or may undesirably cause stress level changes in intentionally stressed dielectric layer portions such as contact etch stop layers e.g., 22.

Advantageously, the PMD layer deposition may optionally take place in a one-step or multi-step process. It will also be appreciated that the RF bias power may be varied (tuned), i.e., from 0 RF bias power to about 1500 Watts, more preferably less than about 1000 Watts, to control a wafer deposition temperature together with optional conventional wafer backside cooling (e.g., liquid or gas cooled wafer support). Preferably, the unchucked low RF bias power HDP-CVD process is carried out at temperatures of less than about 550° C., more preferably less than about 500° C.

Figure 1D:
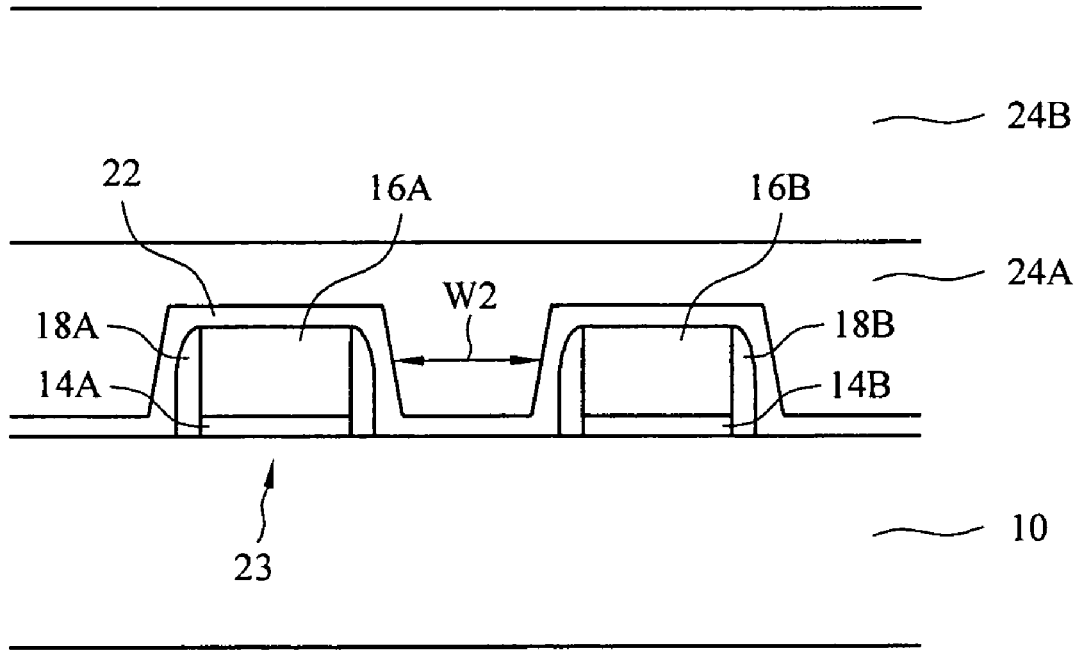

Referring back to FIG. 1D, the unchucked low RF bias power HDP-CVD process may be carried out in a multi-step deposition process, for example, by depositing a first layer 24A to a height above the CMOS devices sufficient to fill the intervening space (gap), e.g., W or W2, between devices 12A and 12B, followed by a second HDP-CVD deposition process to deposit a second remaining portion e.g., 24B, e.g., to a form total PMD layer thickness (e.g., 24A and 24B) of about 9000 to about 9500 Angstroms. For example, the second PMD layer portion 24B may be deposited at a higher D/S ratio compared to the first PMD layer portion 24A, a lower RF bias power, a lower temperature, or a combination of the foregoing. Optional cooling steps may be included between multi-layer deposition steps to avoid undesired thermal stresses.

Conventional processes, such as a CMP planarization process is then carried out to planarize the PMD layer e.g. 24B followed by formation of conductive contacts to the CMOS doped regions to complete the PMD layer formation.

Figure 3:
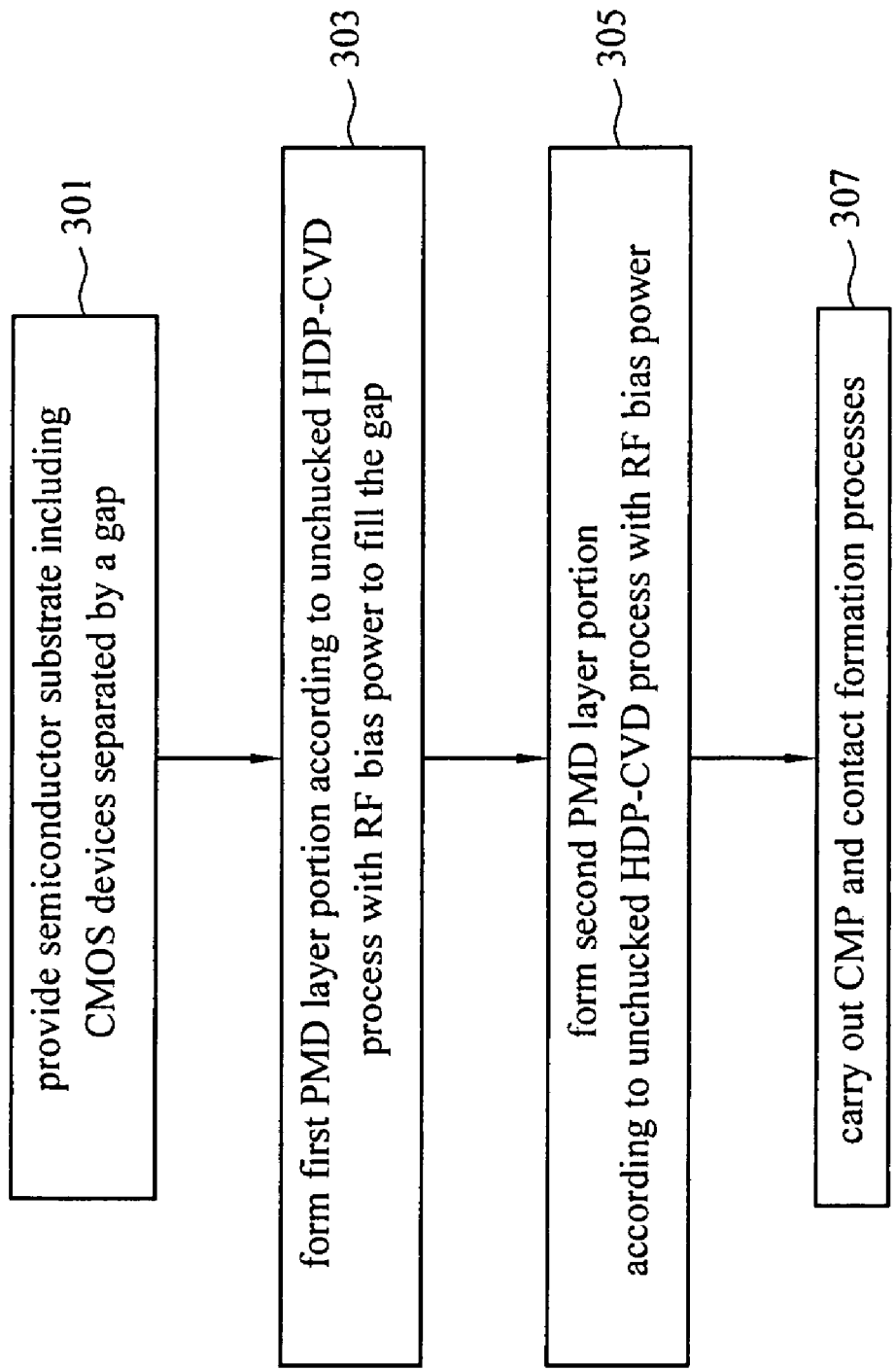
FIG. 3 is a process flow diagram including several embodiments of the present invention.

Referring to FIG. 3 is a process flow diagram showing several embodiments of the present invention. In process 301 a semiconductor substrate including CMOS transistor devices separated by a gap (space) is provided. In process 303, an unchucked HDP-CVD process according to preferred embodiments including an RF bias power to control a deposition temperature is carried out to form a first portion of a PSG PMD layer to fill the gap. In process 305, an unchucked HDP-CVD process according to preferred embodiments including an RF bias power is carried out to form a second portion of a PSG PMD layer. In process 307, conventional processes such as a PMD CMP process and contact formation processes are carried out.

Thus, an HDP-CVD process has been presented for HDP-CVD PMD layer formation to simultaneously improve a gap filling ability while reducing a deposition temperature and reducing plasma damage and/or preferential sputtering damage to underlying material layers and/or CMOS device components. By carrying out the HDP-CVD deposition at reduced RF bias compared to prior art processes as well as avoiding application of a DC Voltage to the process wafer to produce an electrostatic charge for E-chucking the process wafer, the HDP-CVD process may be may be tuned (lower RF bias power) to a lower temperature range to while avoiding plasma damage and/or preferential sputtering damage to underlying material layers including CESL and CMOS device portions.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming an HDP-CVD pre-metal dielectric (PMD) layer comprising the steps of:
   providing a semiconductor substrate comprising at least two overlying semiconductor structures separated by a gap;
   forming a PMD layer according to an HDP-CVD process on the at least two overlying semiconductor structures without applying a chucking bias Voltage to hold the semiconductor substrate;
   wherein the step of forming a PMD layer comprises a multi-layer deposition process comprising the steps of:
   forming a first PMD layer portion according to an HDP-CVD process without applying a chucking bias Voltage to hold the semiconductor substrate; and
   forming a second PMD layer portion on the first PMD layer portion according to an HDP-CVD process without applying a chucking bias Voltage to hold the semiconductor substrate.

2. The method of claim 1, wherein an RF bias is applied to control the semiconductor substrate deposition temperature.

3. The method of claim 2, wherein the RF bias is applied at a level of less than about 1500 Watts.

4. The method of claim 2, wherein the RF bias is applied at a level of less than about 1000 Watts.

5. The method of claim 1, wherein the first PMD layer portion is deposited at a lower deposition/sputter (D/S) ratio compared to the second PMD layer portion.

6. The method of claim 1, wherein the first PMD layer portion is deposited at a higher RF bias compared to the second PMD layer portion.

7. The method of claim 1, wherein the PMD layer is selected from the group consisting of PSG, BPSG, and USG.

8. The method of claim 1, wherein the PMD layer comprises PSG.

9. The method of claim 1, wherein the semiconductor structures comprise CMOS transistors.

10. The method of claim 1, wherein the semiconductor structures comprise an overlying contact etch stop layer.

11. The method of claim 10, wherein the contact etch stop layer is formed having a stress selected from the group consisting of compressive and tensile stress.

12. A method of forming an HDP-CVD pre-metal dielectric (PMD) layer to reduce plasma damage and/or preferential sputtering comprising the steps of:
   providing a semiconductor substrate comprising CMOS transistor structures separated by a gap;
   forming a PMD layer on the CMOS transistor structures according to a multi-layer HDP-CVD process comprising depositing a first PMD portion and depositing a second PMD portion wherein an RF bias is adjusted to control a deposition temperature of the semiconductor substrate in the absence of a chucking bias Voltage applied to the semiconductor substrate; and
   wherein the CMOS transistor structures comprise an overlying contact etch stop layer (CESL).

13. The method of claim 12, wherein the RF bias is applied at a level of less than about 1500 Watts.

14. The method of claim 12, wherein the RF bias is applied at a level of less than about 1000 Watts.

15. The method of claim 12, wherein a first PMD portion is deposited to a level higher than the semiconductor structures followed by deposition of a second PMD portion.

16. The method of claim 12, wherein the first PMD portion is deposited at a lower deposition/sputter (D/S) ratio compared to the second PMD portion.

17. The method of claim 12, wherein the first PMD portion is deposited at a higher RF bias compared to the second PMD portion.

18. The method of claim 12, wherein the PMD layer is selected from the group consisting of PSG, BPSG, and USG.

19. The method of claim 12, wherein the PMD layer comprises PSG.

20. The method of claim 12, wherein the (CESL) is formed having a stress selected from the group consisting of compressive and tensile stress.

21. A method of forming an HDP-CVD pre-metal dielectric (PMD) layer comprising the steps of:
   providing a semiconductor substrate comprising at least two overlying semiconductor structures separated by a gap;
   forming a contact etch stop layer on the semiconductor structures, said contact etch stop layer having a stress selected from the group consisting of compressive and tensile stress; and,
   forming a PMD layer according to a multi-step HDP-CVD process over the contact etch stop layer without applying a chucking bias Voltage to hold the semiconductor substrate.

22. The method of claim 21, wherein the multi-step HDP-CVD process comprises depositing a first PMD layer portion to a level higher than the semiconductor structures followed by deposition of a second PMD layer portion.

23. The method of claim 21, wherein the multi-step HDP-CVD process comprises depositing a first PMD layer portion at a higher RF bias compared to a second PMD layer portion.

24. The method of claim 21, wherein the multi-step HDP-CVD process comprises depositing a first PMD layer portion at a higher semiconductor substrate temperature compared to a second PMD layer portion.

25. The method of claim 1, wherein the first PMD layer portion is deposited to a level higher than the semiconductor structures followed by deposition of the second PMD layer portion.

26. The method of claim 1, wherein the first PMD layer portion is deposited at a higher semiconductor substrate temperature compared to the second PMD layer portion.

27. The method of claim 12, wherein the first PMD portion is deposited at a higher semiconductor substrate temperature compared to the second PMD portion.

* * * * *